United States Patent
Bu et al.

(10) Patent No.: US 8,088,467 B2
(45) Date of Patent: Jan. 3, 2012

(54) CURABLE COMPOSITIONS

(75) Inventors: Lujia Bu, Holden, MA (US); Edward C. Greer, Lower Gwynedd, PA (US); Georg R. Kestler, Hirschaid (DE); Alan I. Nakatani, Lansdale, PA (US); Charles R. Szmanda, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 786 days.

(21) Appl. No.: 12/074,666

(22) Filed: Mar. 5, 2008

(65) Prior Publication Data
US 2008/0226889 A1 Sep. 18, 2008

Related U.S. Application Data

(60) Provisional application No. 60/892,929, filed on Mar. 5, 2007.

(51) Int. Cl.
*B32B 3/02* (2006.01)
*G11B 7/24* (2006.01)

(52) U.S. Cl. ......... 428/65.1; 522/42; 526/282; 526/320; 526/323.2; 526/328.5; 524/266; 264/320; 264/331.18

(58) Field of Classification Search ............ 428/65.1; 522/100, 103, 121, 42; 524/266; 526/282, 526/320, 323.2, 328.5; 264/320, 331, 18
See application file for complete search history.

(56) References Cited

U.S. PATENT DOCUMENTS

| | | | | |
|---|---|---|---|---|
| 4,363,844 | A | 12/1982 | Lewis et al. | |
| 4,814,257 | A | 3/1989 | Galloway | |
| 4,932,750 | A | 6/1990 | Ansel et al. | |
| 5,450,220 | A * | 9/1995 | Onishi et al. | 349/89 |
| 5,533,002 | A | 7/1996 | Abraham | |
| 5,942,302 | A | 8/1999 | Ha et al. | |
| 6,066,684 | A * | 5/2000 | Fujimoto et al. | 522/79 |
| 6,224,805 | B1 | 5/2001 | Fields et al. | |
| 6,482,502 | B1 | 11/2002 | Fields et al. | |
| 6,645,596 | B1 | 11/2003 | Murakami et al. | |
| 6,715,200 | B2 | 4/2004 | Feist et al. | |
| 6,884,843 | B2 * | 4/2005 | Kauffman et al. | 525/55 |
| 7,029,742 | B2 | 4/2006 | Dris et al. | |
| 2002/0032251 | A1 | 3/2002 | Ha et al. | |
| 2004/0110856 | A1 | 6/2004 | Young et al. | |
| 2005/0207330 | A1 | 9/2005 | Kakuta et al. | |
| 2008/0102262 | A1 | 5/2008 | Esaki et al. | |

FOREIGN PATENT DOCUMENTS

| | | |
|---|---|---|
| JP | 2001040246 | 2/2001 |
| WO | WO 2006/121644 A1 | 11/2006 |

OTHER PUBLICATIONS

BASF specialty monomers downloaded from www.plasticizers.basf.com/portal/streamer?fid=217887 on Jan. 28, 2011.*
Gates et al.; "New Approaches to Nanofabrication: Molding, Printing, and Other Techniques"; Chem. Rev. 2005, 105, pp. 1171-1196.

* cited by examiner

*Primary Examiner* — Gerard Higgins
(74) *Attorney, Agent, or Firm* — Thomas S. Deibert

(57) ABSTRACT

Curable compositions are disclosed. Also disclosed are optical media comprising said curable compositions when cured and methods of making such optical media.

9 Claims, No Drawings

CURABLE COMPOSITIONS

The present invention relates to curable compositions for use in optical storage media and to optical storage media comprising such curable compositions. The present invention also relates to methods of making optical storage media.

Conventional high performance optical media information storage technologies with high areal densities, typically expressed as billions of bits per square inch of disk surface area, are one of the key factors in the price reduction per megabyte of storage to date. Notwithstanding, further increases in areal density of optical media continues to be demanded by the industry to accommodate newer technologies, such as digital versatile disks (DVD) and higher density data disks such as digital video recording media (DVR) under the tradename Blu-Ray Disc™. The desire to provide increased areal density necessitates increasingly stringent requirements of the materials and methods used to produce the optical media. Hence improved materials and methods for optimizing the physical and mechanical properties of the optical media are constantly being sought. Some of the design criteria for the materials used in the production of optical media include, for example, high disk flatness, low water strain, low optical retardation, high transparency, heat resistance, scratch resistance, mar resistance, high purity and minimum particulate impurity concentrations. Conventional materials are lacking in one or more of the design requirements, and new materials are required to achieve higher data storage densities in optical media.

In manufacturing optical media, a moldable layer is sometimes molded using a mold which comprises a pattern of features having particular dimensions in the micrometer or nanometer range. When molded, the moldable layer takes on a pattern that is a "negative" of the pattern of features of the mold. The replicated pattern in the moldable layer must exhibit features that are substantially identical to the negative of the pattern of features of the mold. A 90% or greater replication of the depth of the mold features is often required for high areal density optical media.

A method for forming features on substrates by imprinting and imprinting compositions for use in such methods is disclosed in U.S. Patent Application Publication No. 2004/0110856 to Young et al. Specifically, Young et al. disclose imprintable polymer solutions for imprinting, said polymer solutions comprising at least one polymer dissolved in at least one polymerizable monomer and a method of forming features on substrates by imprinting, said method comprising: (a) forming a polymer solution comprising at least one polymer dissolved in at least one polymerizable monomer; and (b) depositing said polymer solution on said substrate to form a liquid film thereon; and then either: (c) curing said liquid film by causing said at least one monomer to polymerize and optionally cross-linking said at least one polymer to thereby form a polymer film, said polymer film having a glass transition temperature of less than 100° C., and imprinting said polymer film with a mold having a desired pattern to form a corresponding negative pattern in said polymer film; or (d) imprinting said liquid film with said mold and curing said liquid film in the presence of said mold to form said polymer film with said negative pattern.

Notwithstanding, it is difficult with currently available materials and methods to consistently and reliably meet the specifications required of data storage media having high areal density capabilities, for example, Blu-Ray Discs™ and HD DVDs. Accordingly, there remains a need in the art for compositions for use in optical data storage media, for optical data storage media comprising such compositions and for methods of manufacturing such media that maximizes the dimensional stability and feature replication of the media's data storage layers.

In one aspect of the present invention, there is provided a curable composition for use in an optical storage medium comprising: a polymerizable material; a polymerization initiator wherein the curable composition when uncured has a viscosity of 1 to 3,000 mPa·s at 25° C.; and, wherein the curable composition when cured exhibits a dynamic storage modulus, E', of 5 to 100 MPa at a temperature of $T_{peak}+60°$ C.

In another aspect of the present invention, there is provided a curable composition, comprising: 50 to 65 wt % of an oligomer; 10 to 20 wt % of a low $T_g$ monomer; 9 to 14 wt % of a high $T_g$ monomer; 10 to 16 wt % of a difunctional monomer; 4 to 9 wt % of a photo initiator; and 0 to 1.5 wt %, for example, 0.1 to 1.5 wt %, of a mold release additive; wherein the curable composition when uncured has a viscosity of 1 to 3,000 mPa·s at 25° C.; wherein the curable composition when cured exhibits a dynamic storage modulus, E', of 5 to 100 MPa at a temperature of $T_{peak}+60°$ C.; and, wherein the curable composition when cured into a freestanding film of 100 micrometers thickness exhibits a transmission of 60 to 100% at 405 nm, the reading wavelength for current Blu-Ray disc technology, or other reading wavelengths.

In another aspect of the present invention, there is provided an optical medium comprising a curable composition of the present invention, wherein the curable composition is a cured curable composition, wherein the optical medium contains information and wherein at least some of the information is stored in the cured curable composition.

In another aspect of the present invention, there is provided an optical medium comprising a curable composition of the present invention, wherein the curable composition is a cured curable composition, wherein the optical medium comprises a layer of the cured curable composition with an average thickness of 0.02 to 0.03 mm; wherein the optical medium contains information and wherein at least some of the information is stored in the layer of the cured curable composition as features embossed in the cured curable composition.

In another aspect of the present invention, there is provided a method for manufacturing an optical medium containing information, comprising: selecting a curable composition, comprising: a polymerizable material; and a polymerization initiator; wherein the curable composition when uncured has a viscosity of 1 to 3,000 mPa·s at 25° C.; wherein the curable composition when cured exhibits a dynamic storage modulus, E', of 5 to 100 MPa at a temperature of $T_{peak}+60°$ C.; depositing the curable composition when uncured on a substrate; exposing the deposited curable composition to a stimulus causing the deposited curable composition to polymerize forming a cured curable composition; providing a mold; pressing the mold into the cured curable composition to form features in the cured curable composition, wherein the features formed in the cured curable composition are readable as information; and, separating the mold and the cured curable composition.

The term "optical retardation" as used herein and in the appended claims in reference to a cured curable composition of the present invention is the optical retardation of a free standing film of that composition having an average thickness of 100 µm measured using an ellipsometer at the reading wavelength for the optical medium in which the cured curable composition is to be used.

The term "functional" as used herein and in the appended claims relative to the polymerizable materials refers to a group that may react to link molecules together to form a polymer, for example, a vinyl group, an epoxide group, a lactone group, a lactam group or an imine group.

The term "FWHM" as used herein and in the appended claims is the full width at half maximum of the master tan δ curve. The FWHM for a cured curable composition is determined in decades of reduced frequency from an isothermal/frequency sweep test obtained using a TA Instruments Q800 Dynamic Mechanical Analyzer (hereinafter "DMA") set to the isothermal/frequency sweep mode with a tensile film clamping geometry according to the instrument instructions. Frequency sweeps are performed at selected temperatures from 0.1 to 200 Hz. The frequency is changed incrementally to yield 6 equally spaced points per decade on a logarithmic scale. The applied strains are varied depending on the temperature to optimize the torque transducer signal, yet remain in the linear viscoelastic regime of the test sample at the test temperature. The linear viscoelastic regime is defined by the strain range where the dynamic mechanical properties of the test sample are independent of strain. The temperature steps are made in 10 degree increments. The isothermal/frequency sweep data obtained from the DMA at a user reference temperature may be shifted according to the following equation:

$$\log a_T = [-c_1(T-T_{ref})]/(c_2+T-T_{ref}) \qquad (1)$$

where $a_T$ is the horizontal shift factor; $c_1$ and $c_2$ are the Williams-Landel-Ferry, WLF, constants; T is the temperature for the data being shifted and $T_{ref}$ is the reference temperature. The resultant curve is referred to as a master curve for a given sample. The master curve shows the dynamic mechanical properties of a sample as a function of reduced frequency over a much broader range of frequencies than can practically be achieved at a single temperature on a single instrument. The FWHM for the purposes of this application are obtained using a reference temperature of 80° C.

The term "grooves" as used herein and in the appended claims refers to features imparted to a layer of a cured curable composition of the present invention. Grooves can be selected from "on-grooves" and "in-grooves". On-grooves are ridges that extend out from the surface of the cured curable composition. In-grooves are valleys that extend into the surface of the cured curable composition.

The term "imprinting pressure" as used herein and in the appended claims is the maximum pressure applied when pressing the mold into the cured curable composition during the pressing operation.

The term "imprinting temperature" as used herein and in the appended claims is the temperature of the mold at the instant before it contacts the cured curable composition for the pressing operation.

The term "information" as used herein and in the appended claims encompasses user data, encoded user data (e.g., user data encoded for compression, error correction, or modulation purposes), device "housekeeping" data such as servo data, address, track or sector information, feedback signals, clock or timing signals, picket codes, or data regarding the position of the reading or writing element and/or substrate, and user data and/or encoded user data combined with another source of data (e.g., error checking, correction bits, or device "housekeeping" data).

The term "multi-layer" as used herein and in the appended claims in reference to optical media refers to optical media having two or more information containing layers.

The term "pits" as used herein and in the appended claims refers to features imparted to a layer of a cured curable composition of the present invention. Pits can be selected from "on-pits" and "in-pits". On-pits are bumps that extend out from the surface of the cured curable composition. In-pits are indentations that extend into the surface of the cured curable composition. In some embodiments of the present invention, the on-pits and/or in-pits extend out of or into on-grooves and/or in-grooves on the surface of the cured curable composition.

The term "reading wavelength" as used herein and in the appended claims refers to the wavelength of light used to read information stored in an optical medium in a layer of a cured curable composition of the present invention.

The term "separating temperature" as used herein and in the appended claims is the temperature of the mold at the instant before it separates from the cured curable composition following the pressing operation.

The glass transition temperature ("$T_g$") for a cured curable composition of the present invention is measured by differential scanning calorimetry (DSC) taking the mid-point in the heat flow versus temperature transition as the $T_g$ value.

The term "$T_{peak}$" as used herein and in the appended claims is the peak tan δ temperature for a cured curable composition determined from a temperature ramp/frequency sweep test obtained using a DMA set to the Multi-Frequency-Strain Mode with a tensile film clamping geometry according to the instrument instructions and using the following instrument settings:

applied strain of 0.05%;
preload force of 0.01 N;
force tracking set to 125%;
applied frequency of 1 Hz;
temperature range −50 to 150° C.; and,
heating rate 2°/min.

The dynamic storage modulus, E', and the dynamic loss modulus, E", are measured and recorded by the DMA as a function of temperature. The DMA also determines and records the loss tangent, tan δ, which is E"/E' and outputs the $T_{peak}$ for the cured curable composition.

The term "transmission" as used herein and in the appended claims in reference to a cured curable composition of the present invention is the percentage of light at the reading wavelength transmitted through a free standing film of that composition having an average thickness of 100 μm as compared to the amount of light at the reading wavelength incident upon the sample.

Substrates suitable for use with the present invention include any conventional substrates that are compatible with the curable composition of the present invention. In some embodiments of the present invention, the substrate is selected from polycarbonate, (meth)acrylates, modified polyphenylene oxide, polyphenylene oxide/polystyrene alloys, cyclic polyolefins (such as polynorbornene) and combinations and blends thereof. In some aspects of these embodiments, the substrate is polycarbonate.

Polymerizable materials suitable for use with the present invention include at least one monofunctional material and at least one multifunctional material. Polymerizable materials may be selected from ethylenically unsaturated monomers, ethylenically unsaturated oligomers, epoxy monomers, epoxy oligomers, epoxides, lactones, lactams and imines.

In some embodiments of the present invention, the polymerizable materials include at least one monofunctional material and at least one multifunctional material, wherein the at least one monofunctional material is selected from monofunctional (meth)acrylates, epoxy (meth)acrylates, and urethane (meth)acrylates; and, wherein the at least one multifunctional material is selected from di and tri-functional (meth)acrylates, epoxy (meth)acrylates, and urethane (meth) acrylates. In some aspects of these embodiments, the polymerizable materials include at least one monofunctional material selected from monoethylenically unsaturated acrylates and methacrylates. In some aspects of these embodiments, the at least one monofunctional material comprises at least two monofunctional materials.

In some embodiments of the present invention, the monofunctional material is selected from monoethylenically unsaturated materials. In some aspects of these embodiments, the monofunctional material is selected from monoethylenically unsaturated materials having a weight average molecular weight of 100 to 100,000. In some aspects of these embodiments, the monofunctional material is selected from monoethylenically unsaturated materials having a weight average molecular weight of 100 to 50,000. In some aspects of these embodiments, the monofunctional material is selected from monoethylenically unsaturated materials having a weight average molecular weight of 100 to 25,000. In some aspects of these embodiments, the monofunctional material is selected from monoethylenically unsaturated materials having a weight average molecular weight of 100 to 15,000. In some aspects of these embodiments, the monofunctional material is selected from monoethylenically unsaturated materials having a weight average molecular weight of 100 to 10,000. In some aspects of these embodiments, the monofunctional material is selected from monoethylenically unsaturated materials having a weight average molecular weight of 100 to 5,000. In some aspects of these embodiments, the monofunctional material is selected from monoethylenically unsaturated materials having a weight average molecular weight of 100 to 4,000. In some aspects of these embodiments, the monofunctional material is selected from monoethylenically unsaturated materials having a weight average molecular weight of 100 to 3,000. In some aspects of these embodiments, the monofunctional material is selected from monoethylenically unsaturated materials having a weight average molecular weight of 100 to 2,000. In some aspects of these embodiments, the monofunctional material is selected from monoethylenically unsaturated materials having a weight average molecular weight of 100 to 1,000. In some aspects of these embodiments, the monofunctional material is selected from monoethylenically unsaturated materials having a weight average molecular weight of 100 to 500.

In some embodiments of the present invention, the at least one multifunctional material is selected from multiethylenically unsaturated materials. In some aspects of these embodiments, the at least one multifunctional material is selected from at least one multiethylenically unsaturated material having 2 to 4 polymerizable vinyl groups. In some aspects of these embodiments, the at least one multifunctional material is selected from at least one multiethylenically unsaturated material having 2 to 3 polymerizable vinyl groups. In some aspects of these embodiments, the at least one multifunctional material is selected from multiethylenically unsaturated materials having a weight average molecular weight of 100 to 100,000. In some aspects of these embodiments, the at least one multifunctional material is selected from multiethylenically unsaturated materials having a weight average molecular weight of 100 to 50,000. In some aspects of these embodiments, the at least one multifunctional material is selected from multiethylenically unsaturated materials having a weight average molecular weight of 100 to 25,000. In some aspects of these embodiments, the at least one multifunctional material is selected from multiethylenically unsaturated materials having a weight average molecular weight of 100 to 15,000. In some aspects of these embodiments, the at least one multifunctional material is selected from multiethylenically unsaturated materials having a weight average molecular weight of 100 to 10,000. In some aspects of these embodiments, the at least one multifunctional material is selected from multiethylenically unsaturated materials having a weight average molecular weight of 100 to 5,000. In some aspects of these embodiments, the at least one multifunctional material is selected from multiethylenically unsaturated materials having a weight average molecular weight of 100 to 4,000. In some aspects of these embodiments, the at least one multifunctional material is selected from multiethylenically unsaturated materials having a weight average molecular weight of 100 to 3,000. In some aspects of these embodiments, the at least one multifunctional material is selected from multiethylenically unsaturated materials having a weight average molecular weight of 100 to 2,000. In some aspects of these embodiments, the at least one multifunctional material is selected from multiethylenically unsaturated materials having a weight average molecular weight of 100 to 1,000. In some aspects of these embodiments, the at least one multifunctional material is selected from multiethylenically unsaturated materials having a weight average molecular weight of 100 to 500.

In some embodiments of the present invention, the polymerization initiator is selected from cationic initiators, radical initiators and combinations thereof. In some embodiments of the present invention, the polymerization initiator is selected from photo initiators, thermal initiators and combinations thereof. Thermal initiators include, for example, thermal radical cure initiators from the classes of peroxides, persulfates and azides. Photo initiators include, for example, benzophenones, acetophenone derivatives, alpha hydroxy ketones, monoacylphosphine oxides, bisacylphosphine oxides. In some embodiments of the present invention, the polymerization initiator is a photo initiator present in the curable composition in sufficient quantity to provide fast cure speeds, reasonable cost, good surface, thorough cure and lack of yellowing upon aging. In some aspects of these embodiments, the polymerization initiator comprises 0.1 wt % to 15 wt % of the uncured curable composition.

In some embodiments of the present invention, there is provided a curable composition for use in an optical storage medium comprising: a polymerizable material; and, a polymerization initiator; wherein the curable composition when uncured has a viscosity of 1 to 3,000 mPa·s at 25° C.; and, wherein the curable composition when cured exhibits a dynamic storage modulus, E', of 5 to 100 MPa at a temperature of $T_{peak}+60°$ C. In some aspects of these embodiments, the curable composition when cured exhibits a dynamic storage modulus, E', of 5 to 80 MPa at a temperature of $T_{peak}+60°$ C.

In some embodiments of the present invention, there is provided a curable composition for use in an optical storage medium comprising: a polymerizable material; and, a polymerization initiator; wherein the curable composition when uncured has a viscosity of 1 to 3,000 mPa·s at 25° C.; wherein the curable composition when cured exhibits a dynamic storage modulus, E', of 5 to 100 MPa at a temperature of $T_{peak}+60°$ C.; and wherein the curable composition when cured into a freestanding film of 100 micrometers average thickness exhibits a transmission of 60 to 100% at the reading wavelength for the optical storage medium. In some aspects of these embodiments, the curable composition when cured into a freestanding film of 100 micrometers average thickness exhibits a transmission of 65 to 100% at the reading wavelength for the optical storage medium. In some aspects of these embodiments, the curable composition when cured into a freestanding film of 100 micrometers average thickness exhibits a transmission of 70 to 100% at the reading wavelength for the optical storage medium. In some aspects of these embodiments, the curable composition when cured into a freestanding film of 100 micrometers average thickness exhibits a transmission of 75 to 100% at the reading wavelength for the optical storage medium. In some aspects of these embodiments, the curable composition when cured into a freestanding film of 100 micrometers average thickness exhibits a transmission of 75 to 99% at the reading wavelength for the optical storage medium. In some aspects of these embodiments, the curable composition when cured into a freestanding film of 100 micrometers average thickness exhibits a transmission of 80 to 99% at the reading wavelength for the optical storage medium. In some aspects of these embodiments, the curable composition when cured into a freestanding film of 100 micrometers average thickness exhibits a transmission of 85 to 99% at the reading wavelength for the optical storage medium.

In some embodiments of the present invention, there is provided a curable composition for use in an optical storage medium comprising: a polymerizable material; and, a polymerization initiator; wherein the curable composition when uncured has a viscosity of 1 to 3,000 mPa·s at 25° C.; wherein the curable composition when cured exhibits a dynamic storage modulus, E', of 5 to 100 MPa at a temperature of $T_{peak}$+60° C.; and wherein the curable composition when cured into a freestanding film of 100 micrometers average thickness exhibits an optical retardation of $\leq$40 nm, for example, $\leq$35 nm, $\leq$30 nm, or $\leq$25 nm, at the reading wavelength.

In some embodiments of the present invention, there is provided a curable composition for use in an optical storage medium comprising: a polymerizable material; and, a polymerization initiator; wherein the curable composition when uncured has a viscosity of 1 to 3,000 mPa·s at 25° C.; wherein the curable composition when cured exhibits a dynamic storage modulus, E', of 5 to 100 MPa at a temperature of $T_{peak}$+60° C.; and wherein the curable composition when cured into a freestanding film of 100 μm average thickness exhibits a transmission 60 to 100%, for example, 65 to 100%, 70 to 100%, 75 to 99%, 80 to 99%, or 85 to 99%, at the reading wavelength, which is 405 nm in the case of current Blu-Ray Disc technology; and an optical retardation of $\leq$40 nm, for example, $\leq$35 nm, $\leq$30 nm, or $\leq$25 nm, at 405 nm or other reading wavelength.

In some embodiments of the present invention, the weight of the cured curable composition is at least 85% of the weight of the uncured curable composition. In some aspects of these embodiments, the weight of the cured curable composition is at least 90% of the weight of the uncured curable composition. In some aspects of these embodiments, the weight of the cured curable composition is at least 95% of the weight of the uncured curable composition. In some aspects of these embodiments, the weight of the cured curable composition is at least 97% of the weight of the uncured curable composition. In some aspects of these embodiments, the weight of the cured curable composition is at least 99% of the weight of the uncured curable composition.

In some embodiments of the present invention, the cured curable composition exhibits a $T_{peak}$ at a temperature of 30 to 180° C. In some aspects of these embodiments, the cured curable composition exhibits a $T_{peak}$ at a temperature of 25 to 100° C. In some aspects of these embodiments, the cured curable composition exhibits a $T_{peak}$ at a temperature of 40 to 100° C.

In some embodiments of the present invention, the cured curable composition exhibits an FWHM of 5-12 decades in reduced frequency. In some aspects of these embodiments, the cured curable composition exhibits an FWHM of 7-9 decades in reduced frequency.

In some embodiments of the present invention, the curable composition comprises a polymerizable material and a polymerization initiator; wherein the curable composition when uncured has a viscosity of 1 to 3,000 mPa·s at 25° C.; wherein the curable composition when cured exhibits a dynamic storage modulus, E', of 5 to 100 MPa, for example, 5 to 80 MPa, at a temperature of $T_{peak}$+60° C.; and wherein the polymerizable material comprises an oligomer; a low $T_g$ monomer having a $T_g$ of 0 to −80° C., for example, −20 to −60° C., or −50 to −60° C.; a high $T_g$ monomer having a $T_g$ of 50 to 140° C., for example, 80 to 100° C., or 90 to 100° C.; and a multifunctional monomer.

In some embodiments of the present invention, there is provided a curable composition comprising: 50 to 65 wt % of an oligomer; 10 to 20 wt % of a low $T_g$ monomer having a $T_g$ of 0 to −80° C., for example, −20 to −60° C. or −50 to −60° C.; 9 to 14 wt % of a high $T_g$ monomer having a $T_g$ of 50 to 140° C., for example, 80 to 100° C. or 90 to 100° C.; 10 to 16 wt % of a difunctional monomer; 4 to 9 wt % of a photo initiator; and 0 to 1.5 wt %, for example, 0.1 to 1.5 wt %, of a mold release additive; wherein the curable composition when uncured has a viscosity of 1 to 3,000 mPa·s at 25° C.; wherein the curable composition when cured exhibits a dynamic storage modulus, E', of 5 to 100 MPa, for example, 5 to 80 MPa, at a temperature of $T_{peak}$+60° C.; and, wherein the curable composition when cured into a freestanding film of 100 micrometers thickness exhibits a transmission of 60 to 100%, for example, 65 to 100%, 70 to 100%, 75 to 99%, 80 to 99%, or 85 to 99%, at 405 nm or other reading wavelength. In some aspects of these embodiments, the oligomer is selected from a bisphenol A epoxy acrylate with a weight average molecular weight of 300 to 2,000. In some aspects of these embodiments, the oligomer is selected from an oxirane, 2,2'-[(1-methylethylidine)bis(4,1-phenyleneoxymethylene)]bis-, homopolymer, 2-propenoate with a weight average molecular weight of 300 to 500. In some aspects of these embodiments, the oligomer is diacrylate of diglycidyl ether bisphenol-A. In some aspects of these embodiments, the oligomer is an alkoxylated bisphenol A diacrylate. In some aspects of these embodiments, the low $T_g$ monomer is selected from $C_6$-$C_{22}$ alkyl acrylates and $C_6$-$C_{22}$ alkoxy acrylates. In some aspects of these embodiments, the low $T_g$ monomer is selected from 2(2-ethoxyethoxy)ethyl acrylate, isodecyl acrylate and combinations thereof. In some aspects of these embodiments, the high $T_g$ monomer is isobornyl acrylate. In some aspects of these embodiments, the difunctional monomer is selected from 1,6-hexanediol diacrylate; tricyclododecanedimethanol diacrylate and combinations thereof. In some aspects of these embodiments, the photo initiator is 1-hydroxy-cyclohexyl-phenyl-ketone. In some aspects of these embodiments of the present invention, the mold release additive is polyether modified polydimethylsiloxane.

In some embodiments of the present invention, the curable composition comprises: 50 to 65 wt % of an oligomer; 10 to 20 wt % of a low $T_g$ monomer selected from $C_6$-$C_{22}$ alkyl acrylates and $C_6$-$C_{22}$ alkoxy acrylates, for example, from 2(2-ethoxyethoxy)ethyl acrylate, isodecyl acrylate and combinations thereof; 9 to 14 wt % of a high $T_g$ monomer, wherein the high $T_g$ monomer is isobornyl acrylate; 10 to 16 wt % of a difunctional monomer selected from 1,6-hexanediol diacrylate, tricyclododecanedimethanol diacrylate and combinations thereof; 4 to 9 wt % of a photo initiator, wherein the photo initiator is 1-hydroxy-cyclohexyl-phenyl-ketone; and 0 to 1.5 wt %, for example, 0.1 to 1.5 wt %, of a mold release additive, wherein the mold release additive is polyether modified polydimethylsiloxane. In some aspects of these embodiments, the oligomer is selected from a bisphenol A epoxy acrylate with a weight average molecular weight of 300 to 2,000. In some aspects of these embodiments, the oligomer is selected from an oxirane, 2,2'-[(1-methylethylidine)bis(4,1-phenyleneoxymethylene)]bis-, homopolymer, 2-propenoate with a weight average molecular weight of 300 to 500. In some aspects of these embodiments, the oligomer is diacrylate of diglycidyl ether bisphenol-A. In some aspects of these embodiments, the oligomer is an alkoxylated bisphenol A diacrylate.

In some embodiments of the present invention, the curable composition further comprises one or more optional additives selected from UV absorbers, fillers, chain transfer agents, plasticizers, wetting agents, stabilizers, adhesion promoters, leveling agents, corrosion inhibitors, antifoaming agents, mold release additives, antisticking agents, fluorine-containing compounds, reactive diluents (e.g., phenoxy ethyl acrylates) and silane-containing compounds.

In some embodiments of the present invention, the curable composition further comprises a mold release additive. In some aspects of these embodiments, the curable composition further comprises a mold release additive selected from dimethyl dichlorosilane, trimethyl chlorosilane and other silanizing agents, poly (perfluoroethers), polyether modified polysiloxanes and combinations thereof.

In some embodiments of the present invention, there is provided an optical medium comprising a cured curable composition of the present invention, wherein the optical medium contains information and wherein at least some of the information is stored in the cured curable composition. In some aspects of these embodiments, at least some of the information is stored in the cured curable composition as features embossed in the cured curable composition. In some aspects of these embodiments, the optical medium is selected from pre-recorded, write once and re-writable media in a format selected from CD, DVD, HD DVD and Blu-Ray Disc™. In some aspects of these embodiments, the optical medium is selected from pre-recorded, write once and re-writable media in the Blu-Ray Disc™ format. In some aspects of these embodiments, the optical medium is a pre-recorded medium in the Blu-Ray Disc™ format.

In some embodiments of the present invention, there is provided an optical medium comprising a cured curable composition of the present invention; wherein the optical medium comprises a layer of the cured curable composition with an average thickness of 0.02 to 0.03 mm, for example, 0.024 to 0.026 mm; wherein the optical medium contains information and wherein at least some of the information is stored in the layer of the cured curable composition as features embossed in the cured curable composition. In some aspects of these embodiments, the features embossed in the cured curable composition comprise at least one of pits and grooves. In some aspects of these embodiments, the features embossed in the cured curable composition comprise a combination of pits and grooves. In some aspects of these embodiments, the features embossed in the cured curable composition comprise pits on-groove (i.e., pits on the top of on-grooves, either as in-pits or on-pits). In some aspects of these embodiments, the features embossed in the cured curable composition comprise in-pits, on-groove. In some aspects of these embodiments, the optical medium is selected from pre-recorded, write once and re-writable media in a format selected from CD, DVD, HD DVD and Blu-Ray Disc™. In some aspects of these embodiments, the optical medium is selected from pre-recorded, write once and re-writable media in the Blu-Ray Disc™ format. In some aspects of these embodiments, the optical medium is a pre-recorded medium in the Blu-Ray Disc™ format.

In some embodiments of the present invention, there is provided an optical medium comprising a cured curable composition of the present invention, wherein the optical medium is a multi-layer device, wherein the optical medium contains information and wherein as least some of the information is stored in the layer of the cured curable composition as features embossed in the cured curable composition. In some aspects of these embodiments, the features embossed in the cured curable composition comprise at least one of pits and grooves. In some aspects of these embodiments, the features embossed in the cured curable composition comprise a combination of pits and grooves. In some aspects of these embodiments, the features embossed in the cured curable composition comprise pits on-groove (i.e., pits on the top of on-grooves, either as in-pits or on-pits). In some aspects of these embodiments, the features embossed in the cured curable composition comprise in-pits, on-groove. In some aspects of these embodiments, the optical medium is selected from pre-recorded, write once and re-writable media in a format selected from CD, DVD, HD DVD and Blu-Ray Disc™. In some aspects of these embodiments, the optical medium is selected from pre-recorded, write once and re-writable media in the Blu-Ray Disc™ format. In some aspects of these embodiments, the optical medium is a pre-recorded medium in the Blu-Ray Disc™ format.

In some embodiments of the present invention, there is provided a method for manufacturing an optical medium containing information, comprising: selecting a curable composition, comprising: a polymerizable material; and, a polymerization initiator; wherein the curable composition when uncured has a viscosity of 1 to 3,000 mPa·s at 25° C.; wherein the curable composition when cured exhibits a dynamic storage modulus, E', of 5 to 100 MPa, for example, 5 to 80 MPa, at a temperature of $T_{peak}+60°$ C.; depositing the curable composition when uncured on a substrate; exposing the deposited curable composition to a stimulus causing the deposited curable composition to polymerize forming a cured curable composition; providing a mold; pressing the mold into the cured curable composition to form features in the cured curable composition, wherein the features are readable as information stored to the optical medium; and, separating the mold and the cured curable composition. In some aspects of these embodiments, the curable composition is selected to exhibit, when cured into a freestanding film of 100 micrometers thickness, a transmission of 60 to 100%, for example, 65 to 100%, 70 to 100%, 75 to 100%, 75 to 99%, 80 to 99%, or 85 to 99%, at the reading wavelength for the optical storage medium.

In some embodiments of the present invention, there is provided a method for manufacturing an optical medium containing information, comprising: selecting a curable composition, comprising: a polymerizable material; and, a polymerization initiator; wherein the curable composition when uncured has a viscosity of 1 to 3,000 mPa·s at 25° C.; wherein the curable composition when cured exhibits a dynamic storage modulus, E', of 5 to 100 MPa, for example, 5 to 80 MPa, at a temperature of $T_{peak}+60°$ C.; depositing the curable composition when uncured on a substrate; exposing the deposited curable composition to a stimulus causing the deposited curable composition to polymerize forming a cured curable composition; providing a mold; pressing the mold into the cured curable composition to form features in the cured curable composition, wherein the features are readable as information stored to the optical medium; and, separating the mold and the cured curable composition. In some aspects of these embodiments, the curable composition is selected to exhibit, when cured into a freestanding film of 100 micrometers thickness, an optical retardation of $\leq 40$ nm, for example, $\leq 35$ nm, $\leq 30$ nm, or $\leq 25$ nm, at the reading wavelength.

In some embodiments of the present invention, the method for manufacturing an optical medium containing information further comprises heating at least one of the mold, the cured curable composition and the substrate before pressing the mold into the cured curable composition. In some aspects of these embodiments, the mold and the cured curable composition are within 10° C., for example, within 5° C., of each other before pressing the mold into the cured curable composition. In some aspects of these embodiments, the mold is heated before pressing the mold into the cured curable composition. In some aspects of these embodiments, the temperature of the mold prior to pressing the mold into the cured curable composition is high enough to initiate a further thermal curing process within the cured curable composition upon pressing of the mold into the cured curable composition. In some embodiments, the cured curable composition can be heated to a temperature above the temperature of the mold before the mold is brought into contact with the cured curable composition. To the extent that the heat capacity of the mold is greater than that of the cured curable composition, this can result in a significant reduction in cycle time compared to heating the mold to the molding temperature, molding, cooling the mold to the separation temperature, and separating the mold from the cured curable composition. In some aspects of these embodiments, the cured curable composition is heated to within 25° C. of its $T_{peak}$ prior to molding. In some further aspects of these embodiments, the temperature of the mold is no more than 35° C. colder than the temperature of the cured curable composition immediately prior to molding.

In some embodiments of the present invention, the method for manufacturing an optical medium containing information, further comprises cooling at least one of the mold, the cured curable composition and the substrate before separating the mold and the cured curable composition.

In some embodiments of the present invention, the temperature of the mold is within 25° C. of the $T_{peak}$ of the cured curable composition at the moment the mold is pressed into the cured curable composition. In some aspects of these embodiments, the temperature of the mold is within 20° C. of the $T_{peak}$ of the cured curable composition at the moment the mold is pressed into the cured curable composition. In some aspects of these embodiments, the temperature of the mold is within 15° C. of the $T_{peak}$ of the cured curable composition at the moment the mold is pressed into the cured curable composition. In some aspects of these embodiments, the temperature of the mold is within 10° C. of the $T_{peak}$ of the cured curable composition at the moment the mold is pressed into the cured curable composition. In some aspects of these embodiments, the temperature of the mold is within 5° C. of the $T_{peak}$ of the cured curable composition at the moment the mold is pressed into the cured curable composition.

In some embodiments of the present invention, the temperature of the mold at the moment the mold is pressed into the cured curable composition is <200° C., for example, 1 to 200° C., 20 to 200° C., 25 to 180° C., 25 to 125° C., or 25 to 75° C.

In some embodiments of the present invention, the temperature of the mold at the moment the mold is pressed into the cured curable composition (i.e., the imprinting temperature) is higher than the temperature of the mold at the moment it is separated from the cured curable composition (i.e., the separating temperature). In some aspects of these embodiments, the separating temperature is 1 to 50° C., for example, 1 to 20° C. or 1 to 10° C., lower than the imprinting temperature.

In some embodiments of the present invention, the mold is pressed into the cured curable composition with a pressure (i.e., the imprinting pressure) of 2.75 to 27.5 MPa.

In some embodiments of the present invention, the uncured curable composition is applied to the substrate in sufficient quantity to provide a layer of cured curable composition on the substrate, wherein the layer of cured curable composition has an average thickness of $\geq 0.1$ μm, for example, 0.1 to 100 μm, 1 to 100 μm, 1 to 50 μm, or 1 to 25 μm.

In some embodiments of the present invention, the polymerizable material is selected to include a mold release additive. In some aspects of these embodiments, the mold release additive is selected from those materials that selectively migrate to the air interface of the uncured curable composition.

In some embodiments of the present invention, the method for manufacturing an optical medium containing information further comprises applying a mold release additive to at least one of the surface of the cured curable composition and the surface of the mold. In some aspects of these embodiments, the method for manufacturing an optical medium containing information, further comprises applying a mold release additive to the surface of the cured curable composition, wherein the mold release additive is interposed between the cured curable composition and the mold during the pressing operation. In some aspects of these embodiments, the method for manufacturing an optical medium containing information, further comprises applying a mold release additive to the surface of the mold, wherein the mold release additive is interposed between the cured curable composition and the mold during the pressing operation.

In some embodiments of the present invention, the polymerizable material is selected to comprise: an oligomer; a low $T_g$ monomer, wherein the low $T_g$ monomer has a $T_g$ of 0 to $-80°$ C., for example, $-20$ to $-60°$ C. or $-50$ to $-60°$ C.; a high $T_g$ monomer, wherein the high $T_g$ monomer has a $T_g$ of 50 to 140° C., for example, 80 to 100° C., or 90 to 100° C.; and a multifunctional monomer, for example, a difunctional monomer. In some aspects of these embodiments, the oligomer is selected from a bisphenol A epoxy acrylate with a weight average molecular weight of 300 to 2,000. In some aspects of these embodiments, the oligomer is selected from an oxirane, 2,2'-[(1-methylethylidine)bis(4,1-phenyleneoxymethylene)] bis-, homopolymer, 2-propenoate with a weight average molecular weight of 300 to 500. In some aspects of these embodiments, the oligomer is diacrylate of diglycidyl ether bisphenol-A. In some aspects of these embodiments, the oligomer is an alkoxylated bisphenol A diacrylate. In some aspects of these embodiments, the low $T_g$ monomer is selected from $C_6$-$C_{22}$ alkyl acrylates and $C_6$-$C_{22}$ alkoxy acrylates. In some aspects of these embodiments, the low $T_g$ monomer is selected from 2(2-ethoxyethoxy)ethyl acrylate, isodecyl acrylate and combinations thereof. In some aspects of these embodiments, the high $T_g$ monomer is isobornyl acrylate. In some aspects of these embodiments, the multifunctional monomer is selected from 1,6-hexanediol diacrylate; tricyclododecanedimethanol diacrylate and combinations thereof. In some aspects of these embodiments, the polymerizable material is selected to further comprise a mold release additive, for example, a polyether modified polydimethylsiloxane. In some aspects of these embodiments, the polymerizable material is selected to comprise 50 to 65 wt % oligomer, 10 to 20 wt % low $T_g$ monomer, 9 to 14 wt % high $T_g$ monomer, 10 to 16 wt % difunctional monomer, and 0.1 to 1.5 wt % mold release additive.

In some embodiments of the present invention, the curable composition when uncured is deposited on the substrate using at least one of roll coating, slot coating, screening, spin coating, patch die coating, slot or extrusion coating, slide or cascade coating, curtain coating; roll coating such as knife over roll (doctor blade) coating, forward and reverse roll coating; gravure coating; dip coating; spray coating; meniscus coating; brush coating; air knife coating; silk screen printing; electrostatic printing; thermal printing processes; and ink jet printing. In some aspects of these embodiments, the curable composition when uncured is deposited on the substrate using spin coating.

One of ordinary skill in the art will know that the thickness and uniformity of a spin-coating deposited curable composition is controlled not only by the selection of viscosity and rheological behavior of the subject composition, but also the temperature, spin rate and acceleration program of the spin station, the airflow over the substrate during spinning and the spin bowl shape, and any energy input or gradients set up during the spin.

In some embodiments of the present invention, the temperature of the mold during at least part of the pressing operation is ±25° C., for example, ±20° C., ±15° C., ±10° C., or ±5° C., of the $T_{peak}$ of the cured curable composition.

In some embodiments of the present invention, the polymerizable material is selected to provide a cured curable composition which exhibits a $T_{peak}$ of 50 to 150° C., for example, 50 to 120° C., 50 to 100° C., or 50 to 80° C.

In some embodiments of the present invention, the optical medium comprises at least two data layers. In some aspects of these embodiments, the optical medium comprises a first data layer, L0, and a second data layer, L1. In some aspects of these embodiments, L0 is a fully or partially reflective layer. In some aspects of these embodiments, a layer of uncured curable composition of the present invention is applied over the fully or partially reflective L0, for example by spin coating, and then cured to form a layer of cured curable composition on L0. In some aspects of these embodiments, the cured curable composition is then imparted with features, wherein the features are readable as information. In some aspects of these embodiments, the cured curable composition is imparted with features through embossing with a mold. In some aspects of these embodiments, L1 comprises the cured curable composition with features formed therein. In some aspects of these embodiments, L1 further comprises a partially reflective material deposited over the cured curable composition.

One of ordinary skill in the art will recognize that the features formed in the cured curable compositions of the present invention will be readable as information using, for example, an atomic force microscope. One of ordinary skill in the art will further recognize that the features formed in the cured curable compositions of the present invention may not be readable optically with a laser without additional treatment, for example, application of a partially reflective material, a fully reflective material and/or a light absorbing material.

Some embodiments of the present invention will now be described in detail in the following Examples.

EXAMPLE 1

Example 1

Curable Composition Preparation

A stainless steel reactor equipped with a mechanical stirrer was charged with 5,600 g of difunctional bisphenol A based epoxy acrylate blended with 1,400 g hexane diol diacrylate (blend available from Sartomer Company as CN104B80); 1,300 g of isobornyl acrylate (available from Sartomer Company as SR506); and 1,000 g of 2-(2-ethoxyethoxy)ethyl acrylate (available from Sartomer Company as SR256). The reactor contents were mixed for 10 minutes, after which 700 g of 1-hydroxy-cyclohexyl-phenyl-ketone (available from Ciba Chemical, Inc. as Irgacure 184) was added. The contents of the reactor were mixed for an additional 30 minutes. The contents of the reactor were then filtered using a 0.1 μm pore size Nanoshield filter (available from CUNO LLC). The filtered material was then degassed.

EXAMPLE 2

Depositing and Curing of Curable Composition

A polycarbonate disc, sputtered with an aluminum reflective layer was used as the substrate. Using conventional spin coating techniques with a spin speed of 5,000 rpm and a spin time of 3 seconds, the curable composition of Example 1 was hand dispensed to the spinning substrate in sufficient quantity to provide a layer of uncured curable composition on the substrate with a uniform thickness of 25 μm.

EXAMPLE 3

Curing of Deposited Layer of Uncured Curable Composition

The deposited layer of uncured curable composition provided in Example 2 was cured for 1.4 seconds using a medium mercury pressure bulb 100 Watt/cm bulb length. The distance from the bulb to the substrate was 12 cm. The curing operation was performed under the following conditions:
UV-A: 216 mJ/cm$^2$
UV-B: 177 mJ/cm$^2$
UV-C: 30 mJ/cm$^2$

EXAMPLE 4

Mold Preparation

A nickel DVD stamper with standard DVD feature dimensions was treated with a mold release additive. Specifically, the stamper was placed in a solution bath equipped with an ultrasonic vibrator adjusted to a frequency of 40 kHz. The bath contents comprised 1% wt/wt of Z-Tetraol/Vertrel®. The DVD stamper was soaked in the bath for 30 seconds with the ultrasonic vibration turned on, followed by 15 seconds of static soaking without vibration. The treated DVD stamper was rinsed cleaned with Vertrel® (available from DuPont). The treated DVD stamper was then rinsed with acetone. The treated DVD stamper was then rinsed with deionized water. The treated DVD stamper was then dried on a hot plate at 120° C. for 5 minutes.

EXAMPLE 5

Pressing Operation

The substrate with the cured curable composition from Example 3 was installed along with the treated DVD stamper from Example 4 in an EVG520HE Semi-Automated Hot Embossing System (available from EV Group) between the top and bottom chucks and the embossing chamber was closed. The top and bottom chucks in the EVG520HE were then heated to 95° C. Once the temperature of the top and bottom chucks stabilized, the chucks were brought together and a 40 kN compressive force was applied between the chucks to force the mold against the cured curable composition for a duration of 120 seconds. The chucks were then cooled to below 50° C. before removal of the compressive force. The substrate with the cured curable composition and the stamper were removed from the EVG520HE. The stamper released from the cured curable composition without extra force.

EXAMPLE 6

Evaluation of Pattern Replicated in Cured Curable Composition

A Dimension 5000 AFM available from Veeco Co was used to evaluate the pattern replicated in the cured curable composition. To measure the pit height, 10×10 µm images were collected. The locations were selected at 10 mm from either edge of the disks. The height of the pits were calculated by Bearing method and averaged from 8 locations. The degree of pattern replication (pit height of the molded disk versus the pit height of the stamper) was used to evaluate the molding behavior of the cured curable composition. The pattern replication was observed to be >94%.

We claim:

1. A curable composition for use as a data storage material in an optical storage medium comprising:
   50 to 65 wt % of an oligomer;
   10 to 20 wt % of a low $T_g$ monomer having a $T_g$ of 0 to −80° C., wherein the low $T_g$ monomer is selected from 2(2-ethoxyethoxy) ethyl acrylate, isodecyl acrylate and combinations thereof;
   9 to 14 wt % of a high $T_g$ monomer having a $T_g$ of 50 to 140° C., wherein high $T_g$ monomer is isobornyl acrylate;
   10 to 16 wt % of a difunctional monomer selected from 1,6-hexanediol diacrylate, tricyclododecanedimethanol diacrylate and combinations thereof;
   4 to 9 wt % of a photo initiator; and
   0.1 to 1.5 wt % of a mold release additive;
   wherein the curable composition when uncured has a viscosity of 1 to 3,000 mPa·s at 25° C.; and,
   wherein the dynamic storage modulus, E', of the curable composition when cured is 5 to 100 MPa at the temperature of $T_{peak}$+60° C.

2. The curable composition of claim 1, wherein the transmission of the curable composition when cured into a freestanding film of 100 micrometers average thickness is 60 to 100% at 405 nm and the optical retardation is ≦40 nm at 405 nm.

3. The curable composition of claim 1, wherein the $T_{peak}$ of the curable composition when cured is at the temperature of 30 to 180° C.

4. The curable composition of claim 1, wherein the peak in tan δ of the curable composition when cured has the full width at half maximum (FWHM) of 9-12 decades in reduced frequency.

5. A curable composition for use as a data storage material in an optical storage medium, comprising:
   50 to 65 wt % of an oligomer;
   10 to 20 wt % of a low $T_g$ monomer having a $T_g$ of 0 to −80° C., wherein the low $T_g$ monomer is selected from 2(2-ethoxyethoxy)ethyl acrylate, isodecyl acrylate and combinations thereof;
   9 to 14 wt % of a high $T_g$ monomer having a $T_g$ of 50 to 140° C. wherein the high $T_g$ monomer is isobornyl acrylate;
   10 to 16 wt % of a difunctional monomer selected from 1,6-hexanediol diacrylate, tricyclododecanedimethanol diacrylate and combinations thereof;
   4 to 9 wt % of a photo initiator; and
   0 to 1.5 wt % of a mold release additive, wherein the mold release additive is a polyether modified polydimethylsiloxane;
   wherein the curable composition when uncured has a viscosity of 1 to 3,000 mPa·s at 25° C.;
   wherein the dynamic storage modulus, E', of the curable composition when cured is 5 to 100 MPa at a temperature of $T_{peak}$+60° C.; and,
   wherein the transmission of the curable composition when cured into a freestanding film of 100 micrometers thickness is 60 to 100% at 405 nm.

6. An optical medium comprising a curable composition of claim 1, wherein the curable composition is a cured curable composition, wherein the optical medium contains information and wherein at least some of the information is stored in the cured curable composition.

7. A method for manufacturing an optical medium containing information, comprising:
   selecting a curable composition, to comprise:
      50 to 65 wt % of an oligomer;
      10 to 20 wt % of a low $T_g$ monomer having a $T_g$ of 0 to −80° C., wherein the low $T_g$ monomer is selected from 2(2-ethoxyethoxy)ethyl acrylate, isodecyl acrylate and combinations thereof;
      9 to 14 wt % of a high $T_g$ monomer having a $T_g$ of 50 to 140° C., wherein the high $T_g$ monomer is isobornyl acrylate;
      10 to 16 wt % of a difunctional monomer selected from 1,6-hexanediol diacrylate, tricyclododecanedimethanol diacrylate and combinations thereof;
      4 to 9 wt % of a photo initiator, wherein the photo initiator is 1-hydroxy-cyclohexyl-phenyl-ketone; and
      0.1 to 1.5 wt % of a mold release additive, wherein the mold release additive is a polyether modified polydimethylsiloxane;
   wherein the curable composition when uncured has a viscosity of 1 to 3,000 mPa·s at 25° C.; wherein the dynamic storage modulus, E', of the curable composition when cured is 5 to 100 MPa at the temperature of $T_{peak}$+60° C.;
   depositing the curable composition when uncured on a substrate;
   exposing the deposited curable composition to a stimulus causing the deposited curable composition to polymerize forming a cured curable composition;
   providing a mold;
   pressing the mold into the cured curable composition to form features in the cured curable composition, wherein the features formed in the cured curable composition are readable as information; and,
   separating the mold and the cured curable composition.

8. The method of claim 7, wherein the curable composition is deposited on the substrate in an amount sufficient to provide the cured curable composition on the substrate with the average thickness of ≧0.1 µm.

9. The method of claim 7, further comprising heating the cured curable composition to a temperature higher than that of the mold prior to the pressing of the mold into the cured curable composition, such that the pressing lowers the temperature of the cured curable composition.

* * * * *